(12) United States Patent
Baney (10) Patent No.: US 11,061,099 B2
(45) Date of Patent: Jul. 13, 2021

(54) SYSTEMS AND METHODS FOR CALIBRATING A WAFER INSPECTION APPARATUS

(71) Applicant: Keysight Technologies, Inc., Santa Rosa, CA (US)

(72) Inventor: Douglas Michael Baney, Santa Clara, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 191 days.

(21) Appl. No.: 16/506,458

(22) Filed: Jul. 9, 2019

(65) Prior Publication Data

US 2020/0088829 A1   Mar. 19, 2020

Related U.S. Application Data

(60) Provisional application No. 62/732,853, filed on Sep. 18, 2018.

(51) Int. Cl.
*G01R 31/26* (2020.01)
*G01R 35/00* (2006.01)

(52) U.S. Cl.
CPC ....... *G01R 35/005* (2013.01); *G01R 31/2635* (2013.01)

(58) Field of Classification Search
CPC ........ G01R 13/00; G01R 23/00; G01R 23/16; G01R 23/18; G01R 27/28; G01R 31/2822; G01R 31/31708; G01R 33/0017; G01R 35/005
See application file for complete search history.

(56) References Cited

U.S. PATENT DOCUMENTS

| | | | |
|---|---|---|---|
| 6,853,666 B2 | 2/2005 | Evans et al. | |
| 6,978,073 B2 | 12/2005 | Yamamoto et al. | |
| 2001/0028251 A1* | 10/2001 | Okayasu | G01R 31/3191 324/532 |
| 2002/0003824 A1 | 1/2002 | Lo et al. | |
| 2008/0315092 A1* | 12/2008 | Kley | C23C 16/52 250/307 |
| 2018/0364301 A1* | 12/2018 | Cole | G01R 31/308 |

* cited by examiner

*Primary Examiner* — Tung X Nguyen (57) ABSTRACT

Illustrative systems and methods disclosed herein pertain to calibrating a wafer inspection apparatus. In one exemplary embodiment, a calibration system includes a wafer emulator in the form of a substrate having a first porthole extending from a bottom major surface of the substrate to a top major surface of the substrate. The first porthole accommodates a fixture that holds an optical fiber such that a proximal end of the optical fiber is coplanar to the top major surface of the substrate. The optical fiber has a light emitting profile that emulates a beam profile of a semiconductor laser element. A laser transmitter is coupled to a distal end of the optical fiber and propagates a laser beam through the optical fiber and out of the proximal end of the optical fiber. The wafer inspection apparatus is arranged to receive the laser beam and use the laser beam for calibration purposes.

20 Claims, 8 Drawing Sheets

SYSTEMS AND METHODS FOR CALIBRATING A WAFER INSPECTION APPARATUS

CROSS-REFERENCE TO RELATED APPLICATIONS

The present application claims priority under 35 U.S.C. § 119(e) from U.S. Provisional Application No. 62/732,853 entitled "SYSTEMS AND METHODS FOR CALIBRATING A WAFER INSPECTION APPARATUS" to Douglas M. Baney, and filed on Sep. 18, 2018. The disclosure of this provisional application is specifically incorporated herein by reference.

BACKGROUND

Lasers have been ubiquitously employed in a wide variety of applications such as optical communications, spectrometry, distance measurement, and detection. Many of these applications are associated with consumer devices, such as cell phone cameras wherein a laser may be used to detect a distance between the camera and an object to be photographed and the distance information used for adjusting a focusing mechanism of the camera. The use of lasers in such applications drives a need to mass-manufacture laser devices at high volume and low cost.

One type of laser that is commonly employed in a wide variety of applications is a vertical cavity surface emitting laser, often referred to as a VCSEL. In certain applications, where light of a greater intensity is desirable, a number of VCSELs are placed in close proximity to each other in an array formation that is referred to henceforth as a VCSEL array (VCSELA).The electrical current drive that is provided to a VCSELA is often pulsed in applications such as a time-of-flight (TOF) application where an emitted optical pulse is used for ranging the distance to an object, or, in cases, such as wafer testing of a VCSELA, where the VCSELA temperature rises under electrical excitation and is minimized by employing a low duty cycle pulsed electrical current drive. The manufacture of VCSELs and VCSELAs typically involves fabricating a number of these devices on a wafer, followed by dicing the wafer to produce individual VCSELs and/or VCSELAs. After dicing, the individual VCSELs and/or VCSELAs may be placed inside a suitable package having external leads that are used by a consumer to connect the VCSEL and/or VCSELA to other components on a printed circuit board, for example.

It is generally more cost effective to perform various types of tests upon a VCSEL or a VCSELA located on a wafer than on a VCSEL or VCSELA placed inside a package, because packaging costs and costs associated with executing other processes upon a package would be lost in terms of scrap and rework if the VCSEL or VCSELA fails the tests. Traditional testing of VCSEL and/or VCSELAs wafers is carried out by using a wafer inspection apparatus. Some of these tests can be complicated and the test results unreliable, particularly when the object-under-test is a VCSELA containing a number of VCSELs that may not be identical to each other. For example, a measured optical power level and/or beam divergence of a first VCSEL located at a first location on a wafer may be different than that of a second VCSEL located at a second location on the wafer. The variations in measurement may occur not only due to inherent differences between the first VCSEL and the second VCSEL but also due to various other factors such as shortcomings in the wafer inspection apparatus. The shortcomings may be caused by various factors such as an optical distortion in a lens, temperature-induced drift, polarization dependence, a non-linear response of an optical-to-electrical converter, and/or a misalignment between two or more components in the wafer inspection apparatus.

The accuracy of the test results can be improved by ensuring that the wafer inspection apparatus is calibrated on a regular basis. In one traditional approach, the calibration is performed by using a preselected VCSELA as a reference object-under-test. This traditional approach turns out to be suboptimal because the VCSELA that is used as the reference tends to change over time due to various factors such as aging, handling, and environmental changes. It is therefore desirable to provide more reliable systems and methods for calibrating a wafer inspection apparatus.

SUMMARY

According to one exemplary embodiment of the disclosure, a calibration system includes a first fixture, a first optical fiber, and a wafer emulator. The first fixture has a first hole extending from a bottom surface of the first fixture to a top surface of the first fixture. The first optical fiber is inserted through the first hole in the first fixture whereby a proximal end of the first optical fiber is exposed at the top surface of the first fixture, the proximal end having a light emitting profile that emulates a beam profile of a semiconductor laser. The wafer emulator includes a substrate having at least a first porthole extending from a bottom major surface of the substrate to a top major surface of the substrate. The first porthole is configured to accommodate insertion of the first fixture whereby the proximal end of the first optical fiber is substantially coplanar to the top major surface of the substrate.

According to another exemplary embodiment of the disclosure, a first fixture and a wafer emulator. The first fixture holds a first optical fiber. The wafer emulator has a substrate having a surface area that matches at least a portion of a major surface of a wafer-under-test that includes a vertical-cavity surface-emitting laser array. A first porthole extends from a bottom major surface of the substrate to a top major surface of the substrate. The first porthole is configured to accommodate insertion of the first fixture whereby a proximal end of the first optical fiber is substantially coplanar to the top major surface of the substrate.

According to yet another exemplary embodiment of the disclosure, a calibration system includes a wafer emulator having a photonic integrated circuit. The photonic integrated circuit has a light emitting surface that emulates at least a portion of a wafer-under-test. The portion of the wafer-under-test includes a first vertical-cavity surface-emitting laser array operable to emit a first laser beam having one or more beam characteristics. The photonic integrated circuit is operable to propagate through the light emitting surface, at least a second laser beam having one or more beam characteristics that substantially match the one or more beam characteristics of the first laser beam emitted by the first vertical-cavity surface-emitting laser array.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, various words such as "proximal," "distal," "top," "bottom," and "end," which are used herein to indicate relative orientations and/or relative locations, should not necessarily be interpreted as absolute orientations and locations. For example, a "bottom" end of a housing that is shown upright in an exemplary illustration of the housing can be located on one side rather than at the "bottom" when the housing is placed on its side in a horizontal position. The phrase "beam profile" as used herein encompasses various parameters such as beam divergence, wavelength, and numerical aperture. Furthermore, the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

In terms of a general overview, the various illustrative systems and methods disclosed herein pertain to a calibration system for calibrating a wafer inspection apparatus. In one exemplary embodiment, a calibration system includes a wafer emulator in the form of a substrate having a first porthole extending from a bottom major surface of the substrate to a top major surface of the substrate. The first porthole accommodates a fixture that holds an optical fiber such that a proximal end of the optical fiber is coplanar to the top major surface of the substrate. The optical fiber has a light emitting profile that emulates a beam profile of a semiconductor laser element. In one embodiment, the light emitting profile of the optical fiber has a single Gaussian spatial mode for emulating a laser having a single Gaussian mode. In another embodiment, the light emitting profile of the optical fiber has a profile that is modeled using one or more basis functions such as Gaussian, HG and/or LG spatial mode basis functions that emulate a semiconductor laser element having a more complex beam profile. In yet another embodiment, where polarization is an emulation parameter, the optical fiber has a light emitting profile of a prescribed orientation, a single varied electric field orientation, and/or multiple varied electric field orientations. A laser transmitter is coupled to a distal end of the optical fiber and propagates a laser beam through the optical fiber and out of the proximal end of the optical fiber. The wafer inspection apparatus is arranged to receive the laser beam and use the laser beam for calibration purposes.

Figure 1:
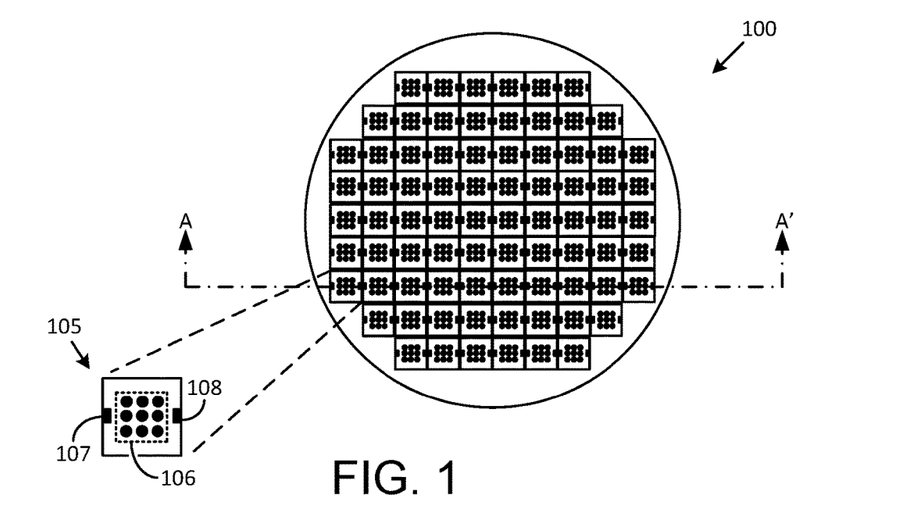
FIG. 1 shows an exemplary wafer containing an array of semiconductor laser elements.

FIG. 1 shows an exemplary wafer 100 containing a number of semiconductor laser elements. Each semiconductor laser element may be one of various types of light-emitting components such as a laser diode, an edge-emitting laser, or a solid-state laser. In the example shown in FIG. 1, each semiconductor laser element is a vertical-cavity surface-emitting laser array (VCSELA) having an array of vertical-cavity surface-emitting lasers. An expanded view of a VCSELA 105, which is one among the multiple VCSELAs in the wafer 100, shows some parts that include an electrode 107, an electrode 108, and a light emitting portion 106. Wires are attached to each of the electrode 107 and the electrode 108 as a part of a manufacturing process that includes packaging the VCSELA 105 in a package having terminals that are used by an end-user for applying power to the VCSELA 105. The package may include additional optical elements, such as a lens or a diffuser, located above the light emitting portion 106. The light emitting portion 106 includes a number of VCSELs arranged in an array formation.

Figure 2:
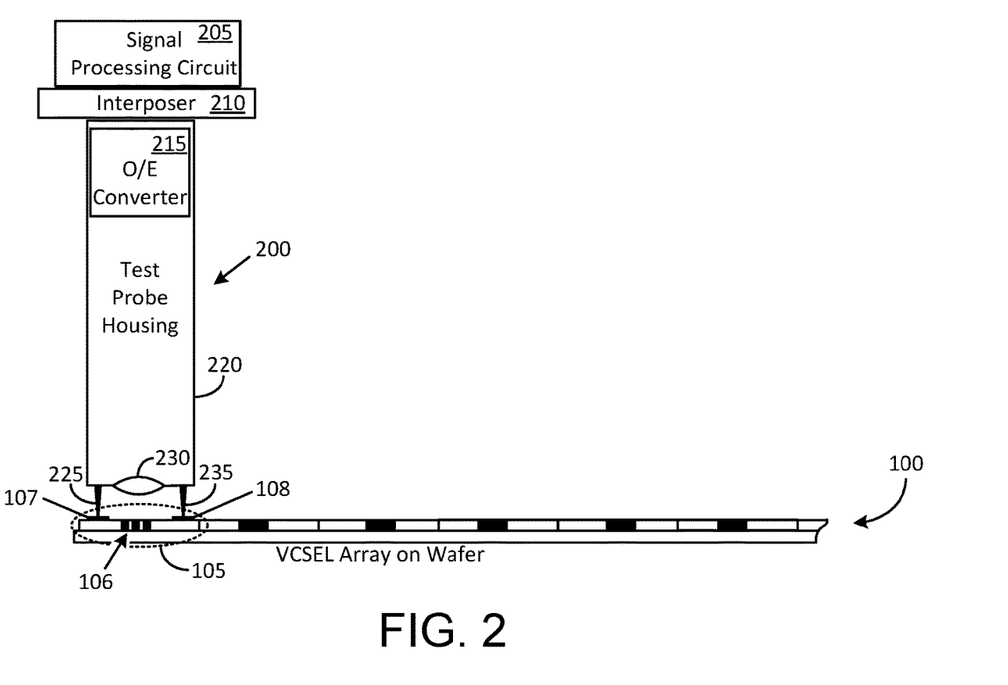
FIG. 2 shows a wafer inspection apparatus mounted upon the exemplary wafer shown in FIG. 1.

FIG. 2 shows a wafer inspection apparatus 200 removably mounted upon the wafer 100 that constitutes a device under test (DUT). Wafer 100 is shown in a cross-sectional view corresponding to an axis A-A' indicated in FIG. 1, and the wafer inspection apparatus 200 is shown placed upon the VCSELA 105 for evaluating the VCSELA 105. The wafer inspection apparatus 200 includes a test probe housing 220 having a lens 230 that is configured to receive and image laser beams emitted by the light emitting portion 106 of the VCSELA 105. The light emitting portion 106 of the VCSELA 105 may be characterized at least in part, by a beam profile. The laser beam is directed by the lens 230 through the test probe housing 220 and is incident upon an optical-to-electrical converter 215. The optical-to-electrical converter 215, which may be a 2-dimensional CMOS imager, generates electrical signals in response to the incident laser beam and propagates the electrical signals to a signal processing circuit 205, via an interposer 210. The signal processing circuit 205 processes the electrical signals to determine various emission characteristics of the VCSELA 105 such as a spatial beam profile of the VCSELA 105.

The wafer inspection apparatus 200 may include pins for providing electrical current to the VCSELA 105 for emitting the laser beam. In this example, the wafer inspection apparatus 200 includes a first pin 225 that is placed in contact with an electrode 107 on the VCSELA 105 and a second pin 235 that is placed in contact with the electrode 108 on the VCSELA 105. The first pin 225 provides a voltage that is applied to the electrode 107 and the second pin 235 provides a return path from the electrode 108 for configuring the VCSELA 105 to emit a set of laser beams from the VCSELs that form the VCSELA 105.

The wafer inspection apparatus 200 can be moved from the VCSELA 105 to other VCSELAs located in the wafer 100 for testing the other VCSELAs. If all the VCSELAs were perfectly identical, a laser beam emitted by each VCSELA would have a beam profile that is identical for all VCSELAs. However, in practice, the beam profile of some or all of the VCSELAs may differ due to various factors such as impurities in the wafer 100, structural variations introduced during fabrication, manufacturing tolerances, and misalignment. The differences between the various VCSELAs may be accurately identified when the wafer inspection apparatus 200 provides consistent and reliable measurements. One way to ensure such measurements is to calibrate the wafer inspection apparatus 200 on a regular and/or intermittent basis.

Figure 3:
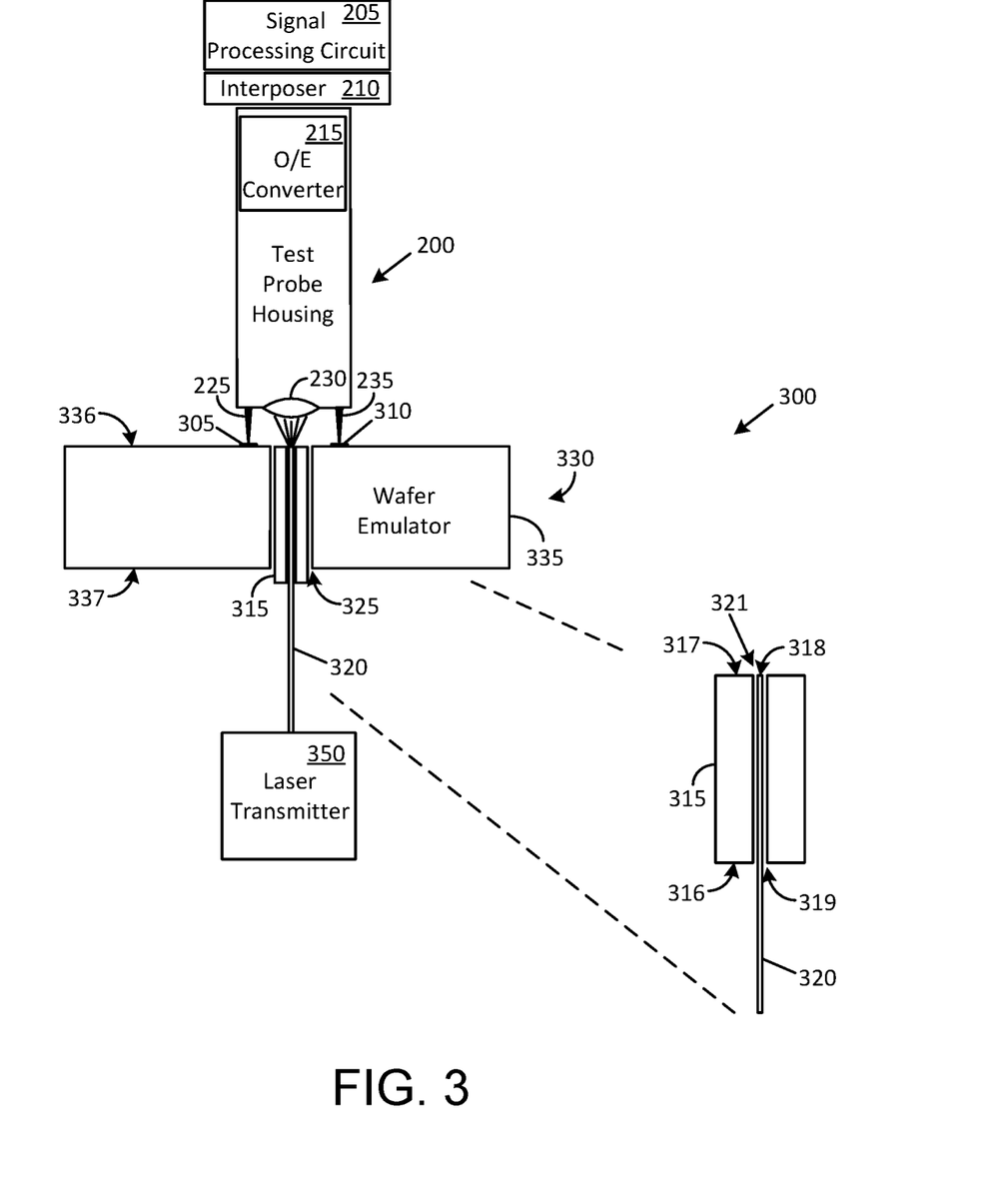
FIG. 3 shows a first exemplary calibration system for calibrating a wafer inspection apparatus in accordance with an embodiment of the disclosure.

FIG. 3 shows a first exemplary calibration system 300 for calibrating a wafer inspection apparatus (such as the wafer inspection apparatus 200) in accordance an embodiment of the disclosure. The calibration system 300 includes a fixture 315 having a hole 319 extending from a bottom surface 316 to a top surface 317 of the fixture 315. An optical fiber 320 is inserted through the hole 319 such that a light-emitting end 318 of the optical fiber 320 is exposed at the top surface 317 of the fixture 315. In one exemplary implementation, the light-emitting end 318 is placed substantially coplanar with the top surface 317 of the fixture 315. In another exemplary implementation, the light-emitting end 318 may be located slightly above or slightly below the top surface 317 of the fixture 315.

The calibration system 300 further includes a wafer emulator 330 having a substrate 335. In an exemplary implementation, the substrate 335 has a porthole 325 extending from a bottom major surface 337 to a top major surface 336 of the substrate 335. The porthole 325 is configured to accommodate insertion of the fixture 315 such that the light-emitting end 318 of the optical fiber 320 and/or an exit port 321 of the porthole 325 is substantially coplanar with the top major surface 336 of the substrate 335. The exit port 321 is configured to allow the optical fiber 320 to emit light having a specified angular divergence.

The top major surface 336 of the substrate 335 may have a surface area that matches the wafer 100 in its entirety or matches only a portion of the wafer 100 (such as a portion of the wafer that includes the VCSELA 105). In this exemplary implementation, the substrate 335 is a planar substrate having a circular perimeter that matches a circular perimeter of the wafer 100 shown in FIG. 1. In other implementations, the substrate 335 may have a non-planar surface, a non-circular perimeter, and/or various other shapes.

The optical fiber 320 is coupled to a laser transmitter 350 for propagating a laser beam through the optical fiber 320 and out of the light-emitting end 318 of the optical fiber 320. One or more characteristics of the laser transmitter 350 and/or the optical fiber 320 is selected to produce a laser beam that is emitted from the light-emitting end 318 of the optical fiber 320 with a light emitting profile that emulates a beam profile of a VCSEL. In one exemplary implementation, the optical fiber 320 is a single-mode optical fiber that is selected to provide a specified numerical aperture that matches a numerical aperture of one or more single-mode VCSELs that may be located in the wafer 100. In another exemplary implementation, the optical fiber 320 is a multi-mode optical fiber that is selected to provide a specified numerical aperture matching a numerical aperture of one or more multi-mode VCSELs that may be located in the wafer 100.

The laser transmitter 350 may include a beam generating circuit that offers a specified level of performance over a specified range of operating conditions, for example wavelength, optical spectrum, and optical power. The calibration system 300 thus operates as a stable platform for calibrating a wafer inspection apparatus, thereby ensuring that the wafer inspection apparatus provides consistent, repeatable, and accurate measurement results.

In this example, the substrate 335 includes an electrode 305 that emulates the electrode 107 on the VCSELA 105 and further includes an electrode 310 that emulates the electrode 108 on the VCSELA 105. Each of the electrode 305 and electrode 310 may be used for placing the wafer inspection apparatus 200 in a substantially identical position as when placed upon the wafer 100, thereby automatically providing alignment between the light-emitting end 318 of the optical fiber 320 and the lens 230 in the wafer inspection apparatus 200.

Figure 4:
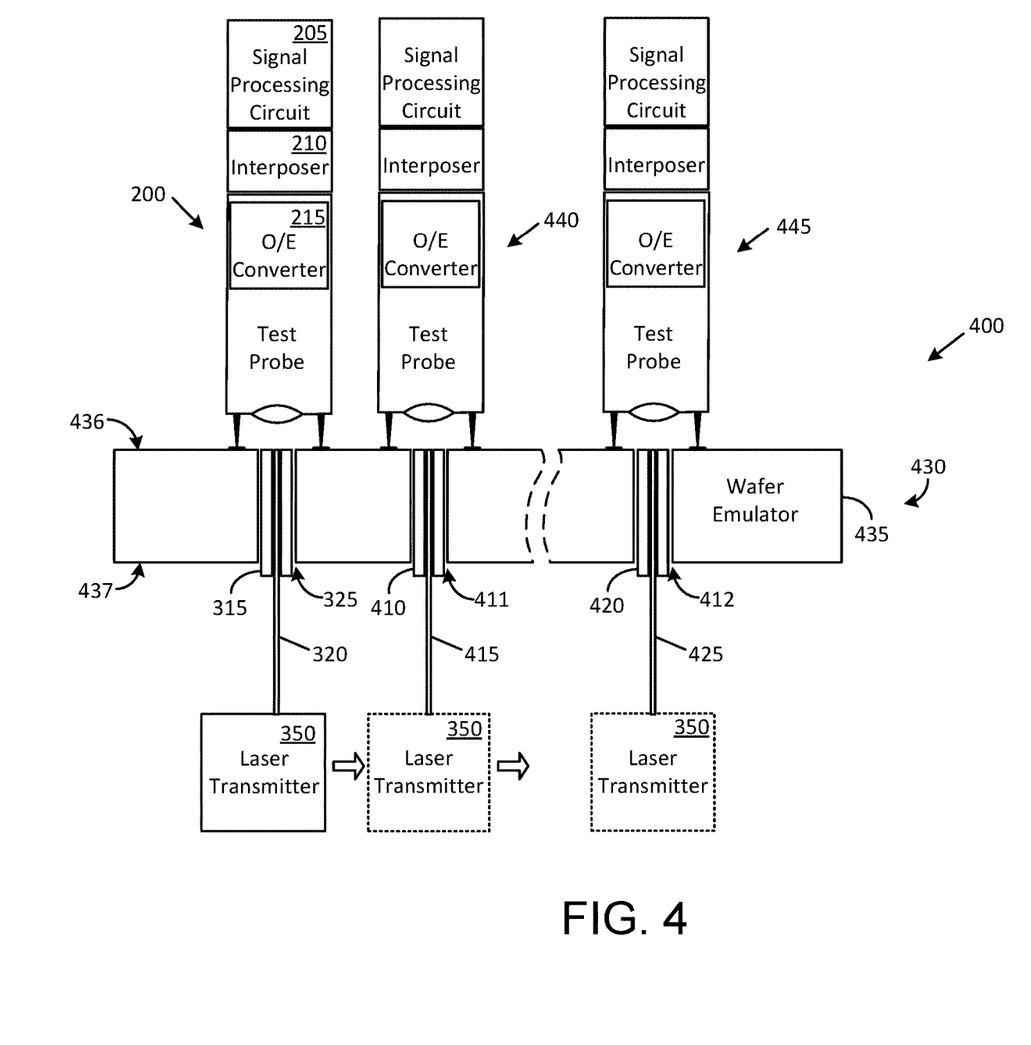
FIG. 4 shows a second exemplary calibration system for calibrating one or more wafer inspection apparatuses in accordance with an embodiment of the disclosure.

FIG. 4 shows a second exemplary calibration system 400 for calibrating one or more wafer inspection apparatuses in accordance an embodiment of the disclosure. The calibration system 400 includes a wafer emulator 430 and "n-1" fixtures (n≥2) in addition to the fixture 315 described above. In this exemplary implementation, the additional fixtures include a fixture 410 that holds an optical fiber 415 and a fixture 420 that holds an optical fiber 425. The wafer emulator 430 has a substrate 435 having "n" portholes that includes the porthole 315 described above. The "n" portholes extend from a bottom major surface 437 to a top major surface 436 of the substrate 435. In this exemplary implementation, the "n" portholes include the porthole 325, a porthole 411, and a porthole 412. The porthole 411 is configured to accommodate insertion of the fixture 410 in an arrangement whereby a light-emitting end of the optical fiber 415 is substantially coplanar with the top major surface 436 of the substrate 435. The porthole 412 is configured to accommodate insertion of the fixture 420 in an arrangement whereby a light-emitting end of an optical fiber 425 is substantially coplanar with the top major surface 436 of the substrate 435.

In one exemplary calibration procedure, the laser transmitter 350 is coupled to the optical fiber 320 for calibrating the wafer inspection apparatus 200. The laser transmitter 350 is then uncoupled from the optical fiber 320 and coupled to the optical fiber 415 for calibrating a wafer inspection apparatus 440 if so desired. Upon completion of calibration of the wafer inspection apparatus 440, the laser transmitter 350 is uncoupled from the optical fiber 415 and coupled to the optical fiber 425 for calibrating a wafer inspection apparatus 445 if so desired. The laser transmitter 350 may be similarly used for calibrating other wafer inspection apparatuses that may be mounted upon the top major surface 436 of the wafer emulator 430.

Figure 5:
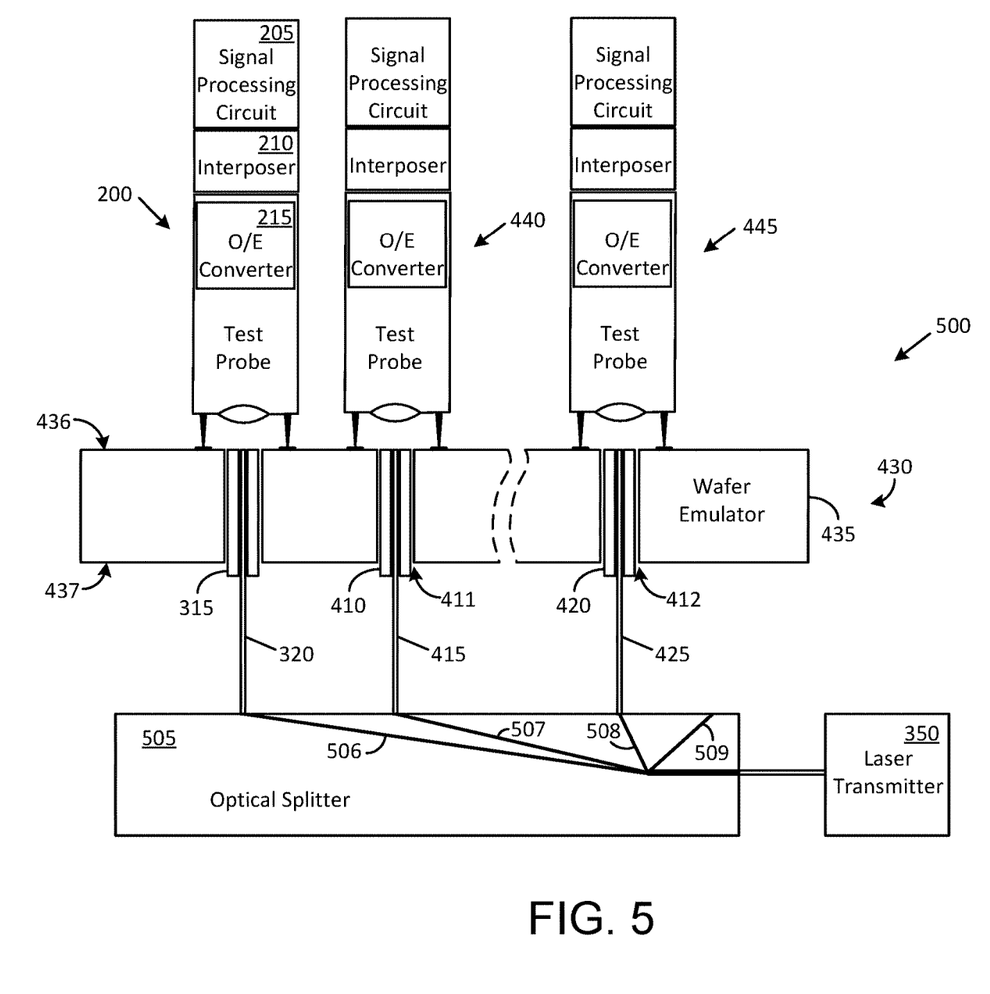
FIG. 5 shows a third exemplary calibration system for calibrating one or more wafer inspection apparatuses in accordance with an embodiment of the disclosure.

FIG. 5 shows a third exemplary calibration system 500 for calibrating one or more wafer inspection apparatuses in accordance an embodiment of the disclosure. Calibration system 500 may include all elements of the calibration system 400 that is described above. The calibration system 500 additionally includes an optical splitter 505. The optical splitter 505 allows simultaneous coupling of a laser beam into "m" (m≥2) optical fibers. In one exemplary implementation, the laser beam is provided to the optical splitter 505 by the laser transmitter 350, and "m" is equal to the number of fixtures inserted into the various portholes in the substrate 435.

When "m" is equal to four for example, the optical splitter 505 may have four optical branches and each optical branch propagates one-fourth of an optical power of a laser beam provided by the laser transmitter 350. The first optical branch 506 is coupled to one end of a first optical fiber (the optical fiber 320), the second optical branch 507 is coupled to one end of a second optical fiber (the optical fiber 415), the third optical branch 508 is coupled to one end of a third optical fiber (the optical fiber 425), and the fourth optical branch 509 is coupled to one end of a fourth optical fiber (not shown).

The calibration system 500 may be used to concurrently calibrate a set of wafer inspection apparatuses (such as the wafer inspection apparatus 200, the wafer inspection apparatus 440, and the wafer inspection apparatus 445). In some embodiments, the number of optical branches provided in the optical splitter 505 may be less than, or greater than, the number of wafer inspection apparatuses. When the number of optical branches is greater than the number of wafer inspection apparatuses, the unused optical branches may be left unconnected or may be used for other purposes.

Figure 6:
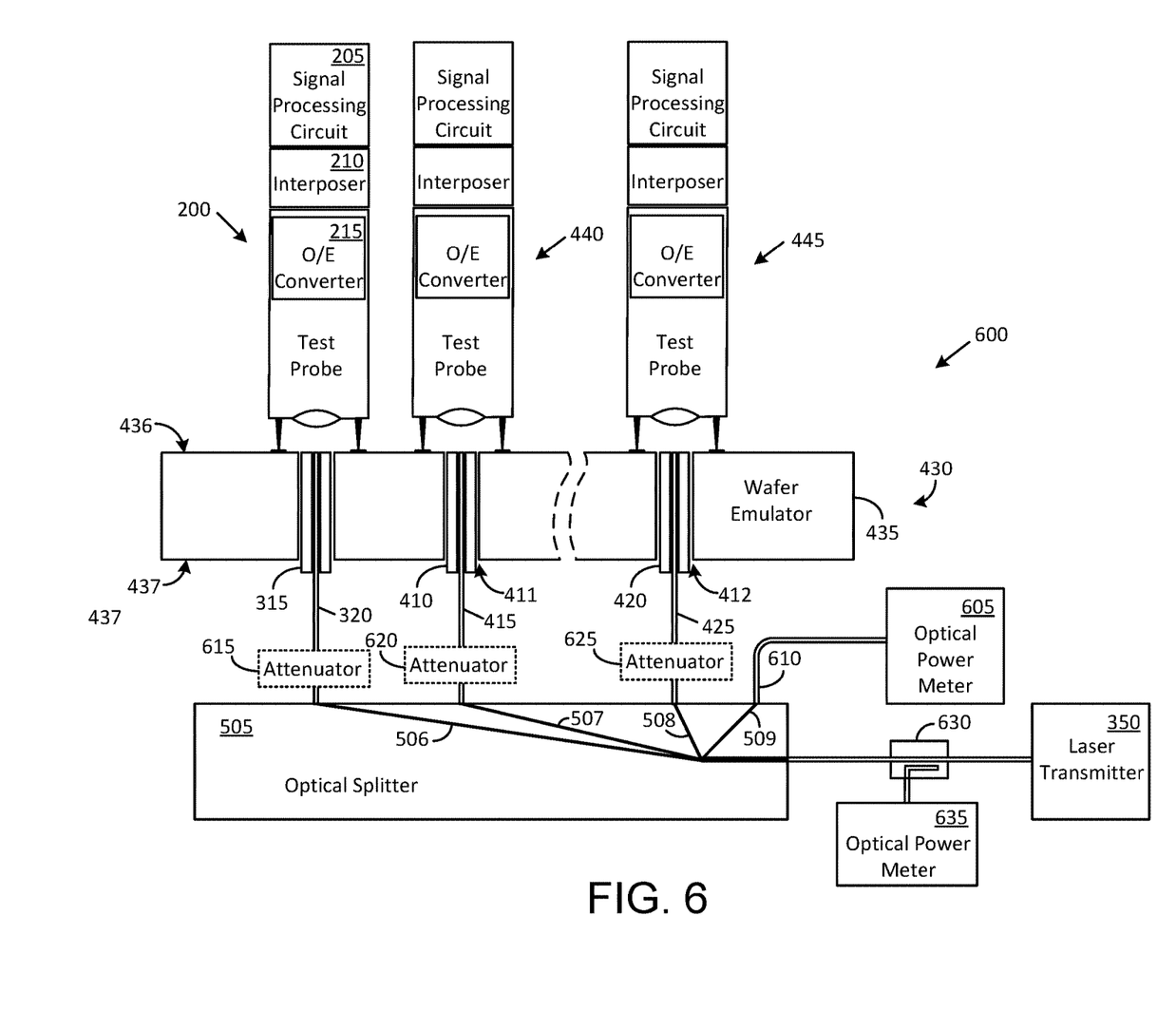
FIG. 6 shows a fourth exemplary calibration system for calibrating one or more wafer inspection apparatuses in accordance with an embodiment of the disclosure.

FIG. 6 shows a fourth exemplary calibration system 600 for calibrating one or more wafer inspection apparatuses in accordance an embodiment of the disclosure. Calibration system 600 includes several elements that are a part of the calibration system 500 and further includes an optical power meter 605 that is coupled to an optical branch 610 of the optical splitter 505. In one exemplary implementation, the optical branch 610 is substantially identical to the other optical branches of the optical splitter 505 and an optical power level measured in the optical power meter 605 is indicative of an optical power of individual optical signals propagated through individual optical branches of the optical splitter 505.

Calibration system 600 may also include an optical coupler 630 and an optical power meter 635. The optical coupler 630 routes into the optical power meter 635, a portion of light that may be reflected by the optical splitter 505 towards the laser transmitter 350. The optical power meter 635 provides an indication of an amount of light reflected by the optical splitter 505 towards the laser transmitter 350 and can be used to reconfigure the calibration system 600 for minimizing or preventing such reflection and protecting the laser transmitter 350.

In another exemplary implementation, an optical attenuator (either fixed or variable) may be inserted in some, or all, of the optical branches. In one exemplary configuration, a variable optical attenuator 615 is inserted between the optical splitter 505 and the optical fiber 320, a variable optical attenuator 620 is inserted between the optical splitter 505 and the optical fiber 415, and a variable optical attenuator 625 is inserted between the optical splitter 505 and the optical fiber 425. The variable optical attenuator 615 may be varied to provide a first level of attenuation to a laser beam propagated from the optical splitter 505 into the optical fiber 320. The first level of attenuation may be determined by a first type of emulation of an optical beam propagated into the wafer inspection apparatus 200. The variable optical attenuator 620 may be varied to provide a second level of attenuation that may be determined by a second type of emulation of an optical beam propagated through the optical fiber 415 and into the wafer inspection apparatus 440. The second level of attenuation can be different than the first level of attenuation. The variable optical attenuator 625 may also be varied based on a third type of emulation of a beam characteristic that is being carried out by using the wafer inspection apparatus 445.

Figure 7:
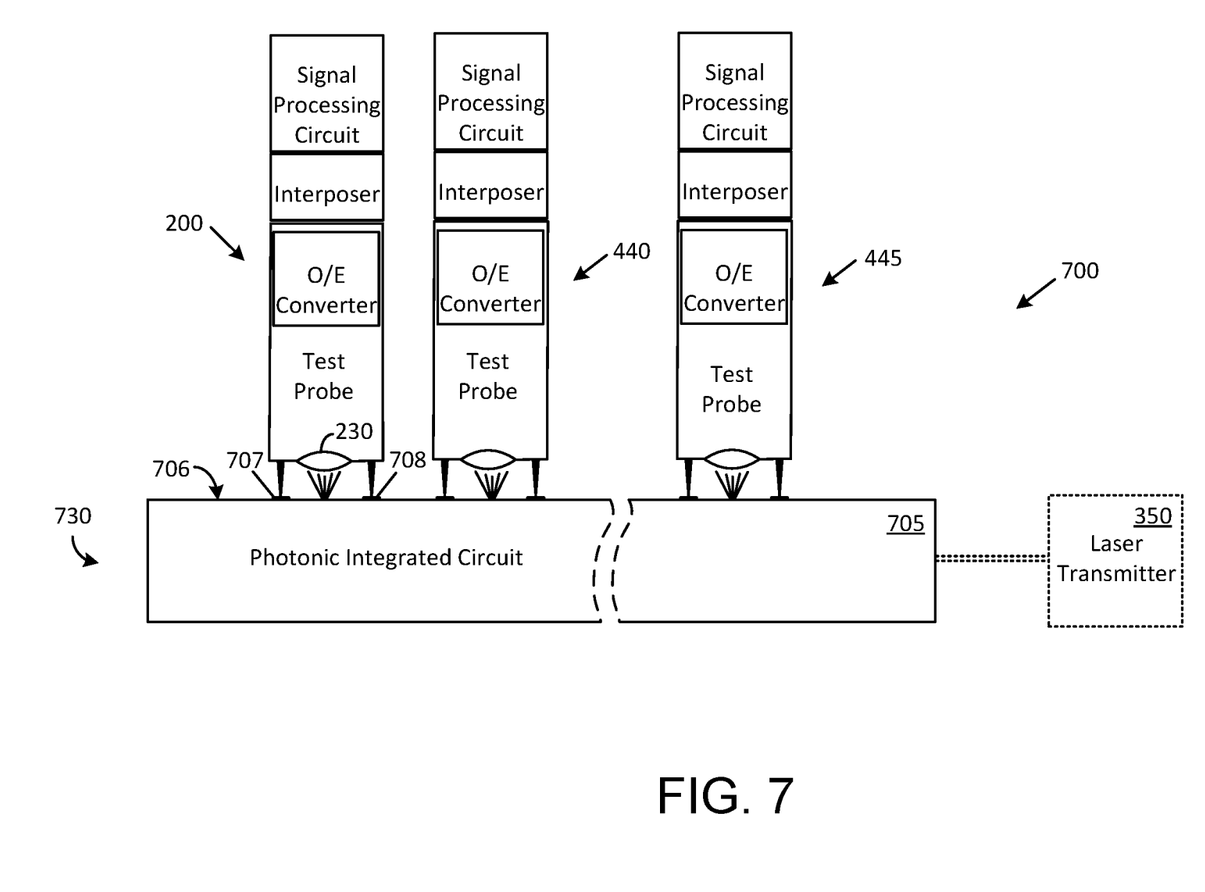
FIG. 7 shows a fifth exemplary wafer inspection apparatus for calibrating one or more wafer inspection apparatuses in accordance with an embodiment of the disclosure.

FIG. 7 shows a fifth exemplary calibration system 700 for calibrating one or more wafer inspection apparatuses in accordance an embodiment of the disclosure. Calibration system 700 includes a wafer emulator 730 in the form of a photonic integrated circuit 705. The photonic integrated circuit 705 has a light emitting surface 706, which emulates at least a portion of a wafer-under-test (such as the wafer 100 shown in FIG. 1) and propagates one or more laser beams at a specified angular divergence. The laser beams may be used for calibrating a set of wafer inspection apparatuses (such as the wafer inspection apparatus 200, the wafer inspection apparatus 440, and the wafer inspection apparatus 445). In the illustrated example, a laser beam emitted by the photonic integrated circuit 705 into the lens 230 of the wafer inspection apparatus 200 has one or more beam characteristics that substantially matches one or more beam characteristics of the VCSELA 105 in the wafer 100. Each of the other laser beams emitted by the photonic integrated circuit 705 into the other wafer inspection apparatuses has one or more beam characteristics that substantially match one or more beam characteristics of other VCSELAs in the wafer 100. The beam characteristic may include various parameters such as a beam divergence, a wavelength, and a numerical aperture.

The light emitting surface 706 may include various types of optical elements for modifying the various beams emitted from the light emitting surface 706. For example, a polarizer may be used to change a polarization of a laser beam and a surface grating may be used to change a wavelength and/or a modal shape of a laser beam.

The light emitting surface 706 may also include several electrodes, such as an electrode 707 that emulates the electrode 107 on the VCSELA 105 and an electrode 708 that emulates the electrode 108 on the VCSELA 105 (shown in FIG. 2). Each of the electrode 707 and electrode 708 may be used for placing the wafer inspection apparatus 200 in a substantially identical position as when placed upon the wafer 100, thereby automatically providing alignment between the light-emitting portion on the light emitting surface 706 and the lens 230 in the wafer inspection apparatus 200.

In one exemplary implementation, the photonic integrated circuit 705 intrinsically includes circuitry for generating one or more laser beams, thereby eliminating the use of the laser transmitter 350. One exemplary circuit for generating the laser beams inside the photonic integrated circuit 705 includes variants of an active component (such as a VCSELA, a distributed feedback laser diode, or a distributed Bragg reflector (DBR) laser diode) and may further include one or more passive components (such as an optical surface grating, a mirror, and a lens).

In another exemplary implementation, the photonic integrated circuit 705 contains passive components only and the laser transmitter 350 is coupled to the photonic integrated circuit 705 for propagation of one or more laser beams through the light emitting surface 706 of the photonic integrated circuit 705. An optical power meter (not shown) may be optionally used to determine an intensity of light emitted from the light emitting surface 706 of the photonic integrated circuit 705 in various implementations in accordance with the disclosure.

In a first exemplary method of operation of the calibration system 700, the photonic integrated circuit 705 is first configured to emit a first laser beam into the lens 230 of the wafer inspection apparatus 200 for calibrating the wafer inspection apparatus 200. The first laser beam is then turned off and the photonic integrated circuit 705 is reconfigured to emit a second laser beam into the wafer inspection apparatus 440 for calibrating the wafer inspection apparatus 440. This procedure may be repeated for calibrating some or all of the other wafer inspection apparatuses that are placed upon the light emitting surface 706 of the photonic integrated circuit 705.

In a second exemplary method of operation of the calibration system 700, the photonic integrated circuit 705 is configured to simultaneously emit a set of laser beams for concurrently calibrating a set of wafer inspection apparatuses such as the wafer inspection apparatus 200, the wafer inspection apparatus 440, and the wafer inspection apparatus 445.

Figure 8:
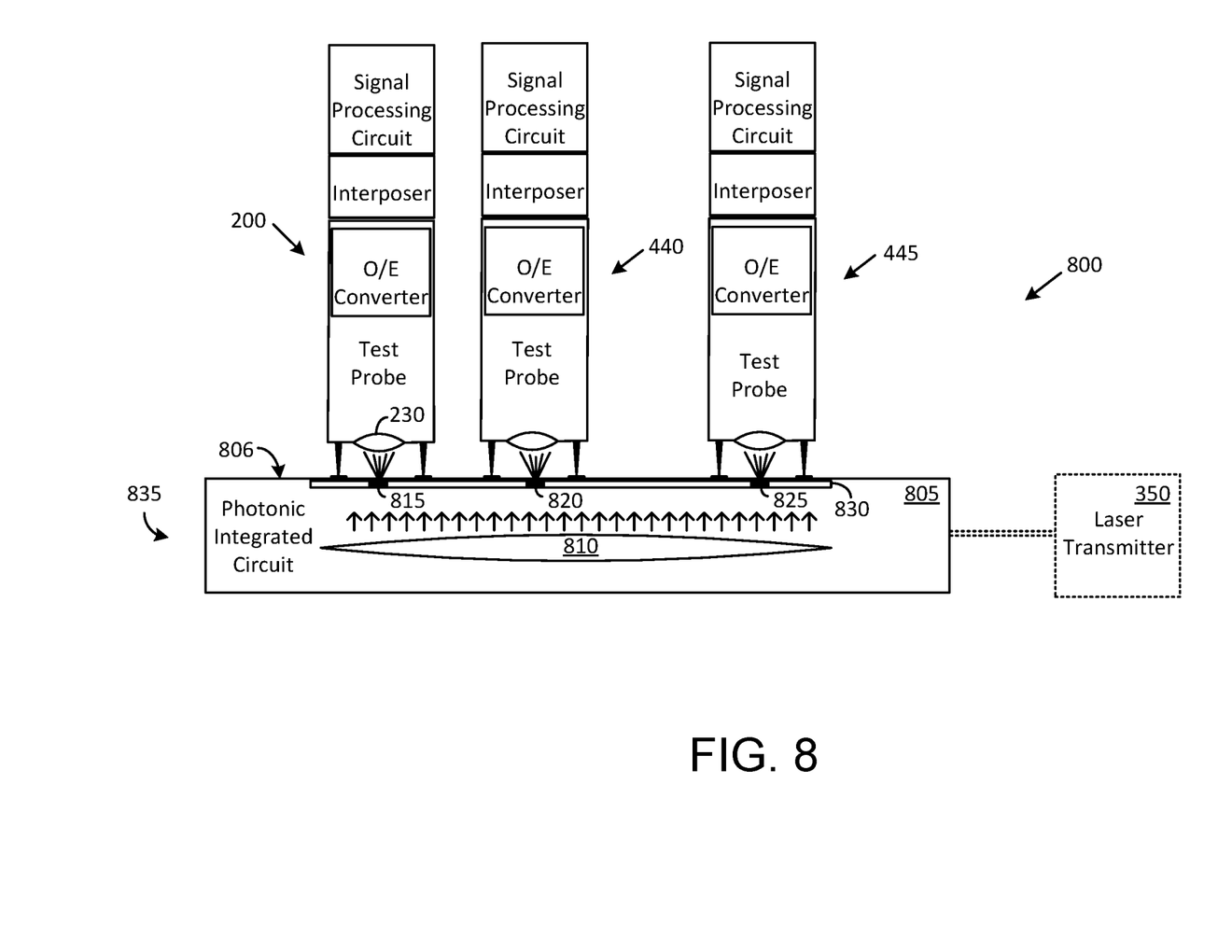
FIG. 8 shows a sixth exemplary wafer inspection apparatus for calibrating one or more wafer inspection apparatuses in accordance with an embodiment of the disclosure.

FIG. 8 shows a sixth exemplary calibration system 800 for calibrating one or more wafer inspection apparatuses in accordance an embodiment of the disclosure. Calibration system 800 includes a wafer emulator 835 in the form of a photonic integrated circuit 805. The photonic integrated circuit 805 includes one or more light directing elements such as a lens system 810, that receive a laser beam from the laser transmitter 350 and convert the laser beam into distributed light. The distributed light is directed upwards and backlights a light emitting surface 806 of the photonic integrated circuit 805. In this embodiment, the light emitting surface 806 includes a masked plate 830 that is arranged to receive the distributed light from the lens system 810 which may be a single lens or an array of lenses that receive light and direct light up towards the masked plate 830. The masked plate 830 has a set of apodized apertures providing a prescribed spatial beam profile for directing the distributed light into one or more wafer inspection apparatuses such as the wafer inspection apparatus 200, the wafer inspection apparatus 440, and the wafer inspection apparatus 445, that are placed upon the masked plate 830. In the illustrated example, an apodized aperture 815 is arranged to confer a predefined beam profile upon a first portion of the distributed light laser light and to direct the apodized light into the wafer inspection apparatus 200. Apodized aperture 820 and apodized aperture 825 operate in a similar manner and direct apodized light into the wafer inspection apparatus 440 and the wafer inspection apparatus 445 respectively.

In one exemplary implementation, the masked plate 830 is a glass plate. In another exemplary implementation, the masked plate 830 is a liquid crystal display (LCD) screen. The LCD screen can be controlled by a controller (not shown) for gating and/or modulating the distributed light received from the lens system 810. In yet another exemplary implementation, the masked plate 830 is a digital light processing (DLP) screen. The DLP screen can be controlled by a controller (not shown) for gating and/or modulating the distributed light received from the lens system 810.

Figure 9:
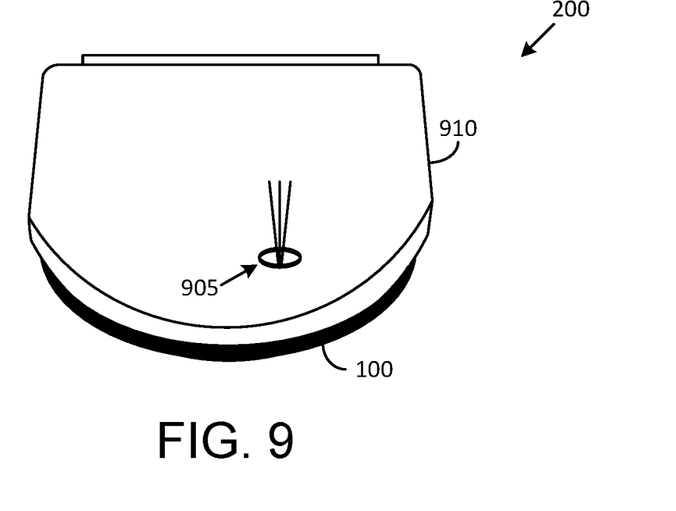
FIG. 9 shows a structural representation of a wafer inspection apparatus in accordance with an exemplary implementation of the disclosure.

FIG. 9 shows a structural representation of the wafer inspection apparatus 200 described above. The wafer inspection apparatus 200 includes a wafer chuck 910 having a porthole 905 through which a laser beam is emitted by a VCSELA in the wafer 100. The laser beam can be received in the lens 230 (not shown) of the wafer inspection apparatus 200.

Figure 10:
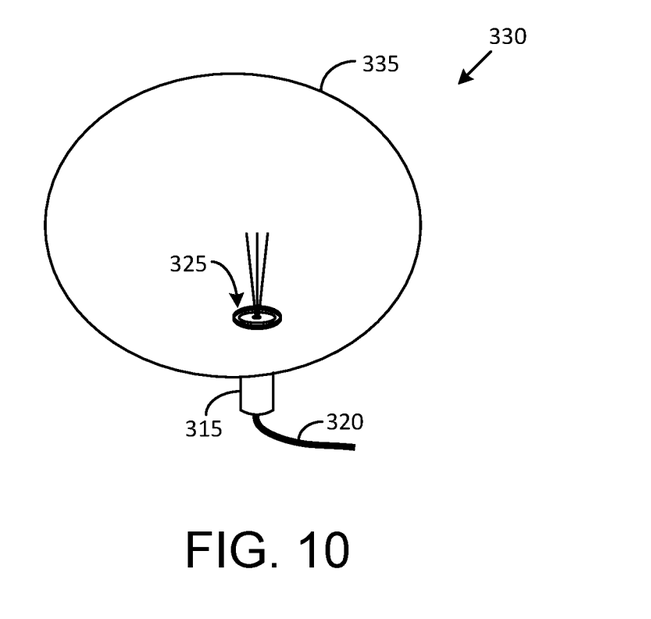
FIG. 10 shows a structural representation of a wafer emulator in accordance with an exemplary implementation of the disclosure.

FIG. 10 shows a structural representation of the wafer emulator 330, which replaces the wafer 100 shown in FIG. 8, when calibration of the wafer inspection apparatus 200 (not shown) is desired. The wafer emulator 330 includes the substrate 335 having the porthole 325 extending through the substrate 335. The porthole 325 is configured to accommodate insertion of the fixture 315 such that the light-emitting end of the optical fiber 320 is substantially coplanar with the top major surface of the substrate 335. The porthole 325 is further configured to allow light emitted from the light-emitting end of the optical fiber 320 to propagate through the porthole 905 of the wafer chuck 910 when the wafer emulator 330 is placed below the wafer chuck 910 in place of the wafer 100.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A calibration system comprising:
   a first fixture having a first hole extending from a bottom surface of the first fixture to a top surface of the first fixture;
   a first optical fiber inserted through the first hole in the first fixture whereby a proximal end of the first optical fiber is exposed at the top surface of the first fixture, the proximal end having a light emitting profile that emulates a beam profile of a semiconductor laser element; and
   a wafer emulator comprising a substrate having at least a first porthole extending from a bottom major surface of the substrate to a top major surface of the substrate, the first porthole configured to accommodate insertion of the first fixture whereby the proximal end of the first optical fiber is substantially coplanar to the top major surface of the substrate.

2. The calibration system of claim 1, wherein the substrate is a planar substrate having a first circular perimeter that matches a second circular perimeter of a wafer-under-test.

3. The calibration system of claim 2, wherein the semiconductor laser element is a vertical-cavity surface-emitting laser array.

4. The calibration system of claim 2, wherein the wafer-under-test includes a vertical-cavity surface-emitting laser array, the vertical-cavity surface-emitting laser array comprising an array of vertical-cavity surface-emitting lasers.

5. The calibration system of claim 4, further comprising a laser transmitter coupled to a distal end of the first optical fiber, the laser transmitter configured to transmit a first laser beam having one or more characteristics that substantially match one or more characteristics of a second laser beam emitted by the vertical-cavity surface-emitting laser array.

6. The calibration system of claim 1, further comprising:
   a second fixture having a second hole extending from a bottom surface of the second fixture to a top surface of the second fixture; and a second optical fiber inserted through the second hole in the second fixture whereby a proximal end of the second optical fiber is exposed at the top surface of the second fixture, and wherein the substrate has a second porthole extending from the bottom major surface of the substrate to the top major surface of the substrate, the second porthole configured to accommodate insertion of the second fixture whereby the proximal end of the second optical fiber is substantially coplanar to the top major surface of the substrate.

7. The calibration system of claim 6, further comprising:
an optical splitter having a first optical branch coupled to a distal end of the first optical fiber and a second optical branch coupled to a distal end of the second optical fiber; and
a laser transmitter coupled to the optical splitter, the laser transmitter configured to transmit a laser beam into the optical splitter whereby a first portion of the laser beam is propagated by the optical splitter into the distal end of the first optical fiber and a second portion of the laser beam is propagated by the optical splitter into the distal end of the second optical fiber.

8. The calibration system of claim 7, further comprising:
a first optical power meter coupled to a third optical branch of the optical splitter for receiving a third portion of the laser beam transmitted by the laser transmitter.

9. A calibration system comprising:
a first fixture that holds a first optical fiber; and
a wafer emulator comprising a substrate, the substrate comprising:
a surface area that matches at least a portion of a major surface of a wafer-under-test that includes a vertical-cavity surface-emitting laser array; and
a first porthole extending from a bottom major surface of the substrate to a top major surface of the substrate, the first porthole configured to accommodate insertion of the first fixture whereby a proximal end of the first optical fiber is substantially coplanar to the top major surface of the substrate.

10. The calibration system of claim 9, wherein the vertical-cavity surface-emitting laser array is characterized at least in part by a first beam profile, and further wherein the first optical fiber has a second beam profile that substantially matches the first beam profile of the vertical-cavity surface-emitting laser array.

11. The calibration system of claim 10, further comprising a laser transmitter coupled to a distal end of the first optical fiber, the laser transmitter configured to transmit a first laser beam having one or more characteristics that substantially match one or more characteristics of a second laser beam emitted by the vertical-cavity surface-emitting laser array.

12. The calibration system of claim 10, wherein the vertical-cavity surface-emitting laser array further comprises a first electrode, and wherein the substrate comprises a second electrode that substantially matches the first electrode.

13. The calibration system of claim 9, further comprising:
a second porthole extending from the bottom major surface of the substrate to the top major surface of the substrate, the second porthole configured to accommodate a second fixture that holds a second optical fiber in an arrangement whereby a proximal end of the second optical fiber is substantially coplanar to the top major surface of the substrate.

14. The calibration system of claim 13, further comprising:
an optical splitter having a first optical branch coupled to a distal end of the first optical fiber and a second optical branch coupled to a distal end of the second optical fiber; and
a laser transmitter coupled to the optical splitter, the laser transmitter configured to transmit a laser beam into the optical splitter whereby a first portion of the laser beam is propagated by the optical splitter into the distal end of the first optical fiber and a second portion of the laser beam is propagated by the optical splitter into the distal end of the second optical fiber.

15. A calibration system comprising:
a wafer emulator comprising a photonic integrated circuit having a light emitting surface that emulates at least a portion of a wafer-under-test, the portion of the wafer-under-test including a first vertical-cavity surface-emitting laser array operable to emit a first laser beam having one or more beam characteristics, the photonic integrated circuit operable to propagate through the light emitting surface, at least a second laser beam having one or more beam characteristics that substantially match the one or more beam characteristics of the first laser beam emitted by the first vertical-cavity surface-emitting laser array.

16. The calibration system of claim 15, further comprising:
a laser transmitter coupled to the photonic integrated circuit, the laser transmitter configured to transmit the second laser beam into the photonic integrated circuit for propagation through the light emitting surface of the photonic integrated circuit.

17. The calibration system of claim 15, wherein the second laser beam that is propagated through the light emitting surface of the photonic integrated circuit is generated by a second vertical-cavity surface-emitting laser array located in the photonic integrated circuit.

18. The calibration system of claim 15, wherein the portion of the wafer-under-test includes a second vertical-cavity surface-emitting laser array operable to emit a third laser beam having one or more beam characteristics, the photonic integrated circuit further operable to propagate through the light emitting surface, a fourth laser beam having one or more beam characteristics that substantially match the one or more beam characteristics of the third laser beam emitted by the second vertical-cavity surface-emitting laser array.

19. The calibration system of claim 15, wherein the light emitting surface of the photonic integrated circuit has a surface area that substantially matches a major surface of the portion of the wafer-under-test.

20. The calibration system of claim 15, wherein the one or more beam characteristics of the first laser beam includes a numerical aperture.

* * * * *